(12) United States Patent
Park et al.

(10) Patent No.: US 7,560,394 B2
(45) Date of Patent: Jul. 14, 2009

(54) NANODOTS FORMED ON SILICON OXIDE AND METHOD OF MANUFACTURING THE SAME

(75) Inventors: Young-soo Park, Suwon-si (KR); Wan-jun Park, Seoul (KR); Alexander Alexandrovich Saranin, Vladivostok (RU); Andrey Vadimovich Zotov, Vladivostok (RU)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 199 days.

(21) Appl. No.: 11/183,240

(22) Filed: Jul. 18, 2005

(65) Prior Publication Data

US 2006/0014329 A1    Jan. 19, 2006

(30) Foreign Application Priority Data

Jul. 16, 2004    (KR)    .................... 10-2004-0055617

(51) Int. Cl.
- *H01L 21/31* (2006.01)
- *H01L 21/469* (2006.01)
- *H01L 29/06* (2006.01)
- *H01L 29/788* (2006.01)
- *H01L 21/20* (2006.01)

(52) U.S. Cl. .................. 438/775; 257/14; 257/321; 257/324; 438/478; 977/742; 977/777

(58) Field of Classification Search ........... 438/775, 438/478; 257/14, 325, 321, 328, 766, 784; 977/742, 777, 778

See application file for complete search history.

(56) References Cited

U.S. PATENT DOCUMENTS

| | | | |
|---|---|---|---|
| 5,714,766 A * | 2/1998 | Chen et al. .................... 257/17 |
| 6,593,624 B2 | 7/2003 | Walker | |
| 6,740,928 B2 * | 5/2004 | Yoshii et al. ................. 257/315 |
| 6,815,781 B2 | 11/2004 | Vyvoda et al. | |
| 6,841,813 B2 | 1/2005 | Walker et al. | |
| 6,881,994 B2 | 4/2005 | Lee et al. | |
| 6,897,514 B2 | 5/2005 | Kouznetsov et al. | |
| 6,992,349 B2 | 1/2006 | Lee et al. | |
| 7,105,425 B1 * | 9/2006 | Krivokapic ................. 438/481 |
| 7,129,538 B2 * | 10/2006 | Lee et al. .................... 257/321 |
| 7,250,646 B2 | 7/2007 | Walker et al. | |
| 2004/0207001 A1 | 10/2004 | Kouznetsov et al. | |
| 2006/0249735 A1 | 11/2006 | Walker et al. | |

(Continued)

FOREIGN PATENT DOCUMENTS

CN    1 401 140 A    3/2003

(Continued)

OTHER PUBLICATIONS

Tersoff, et al., "Self-Organization in Growth of Quantum Dot Superlattices", Physical Review Letters, 76(10):1675-1678 (Mar. 4, 1996).

(Continued)

*Primary Examiner*—Chuong Anh Luu
(74) *Attorney, Agent, or Firm*—Lee & Morse, P.C.

(57) ABSTRACT

A nanodot material including nanodots formed on silicon oxide, and a method of manufacturing the same, is provided. The nanodot material includes a substrate, a silicon oxide layer, and a plurality of nanodots on the silicon oxide layer.

25 Claims, 3 Drawing Sheets

U.S. PATENT DOCUMENTS

2007/0029607 A1 2/2007 Kouznetzov

FOREIGN PATENT DOCUMENTS

KR 2001-0009227 2/2001

OTHER PUBLICATIONS

Brune, et al., "Self-organized growth of nanostructure arrays on strain-releif patterns", Nature, vol. 394, pp. 451-453, (Jul. 30, 1998).

Kotlyar, et al., "Formation of the ordered array of Al magic clusters on Si(111)7×7", Physical Review B 66, 165401-1 (-4), The American Physical Society, (2002).

* cited by examiner

NANODOTS FORMED ON SILICON OXIDE AND METHOD OF MANUFACTURING THE SAME

BACKGROUND OF THE INVENTION

1. Field of the Invention

The present invention relates to nanodots formed on silicon oxide and a method of manufacturing the same. More particularly, the present invention relates to nanodots whose location can be controlled so that the nanodots are regularly arranged on the silicon oxide.

2. Description of the Related Art

Nanodots may be used in a wide variety of optical devices including, e.g., light emitting diodes (LEDs), laser diodes (LDs) and photodetectors. Nanodots may also be used in, e.g., single electron transistors, etc. Though the use of nanodots, it may be possible improve the performance of a device by, e.g., reducing a threshold current of the device, improving retention characteristics, increasing an optical gain, etc.

As an example, when a plurality of nanodots are distributed throughout a floating gate of a flash memory device, the current required for storing information may be smaller than the current required for a conventional flash memory device having no nanodots, and, thus, the amount of power consumed may be decreased by using the nanodot device. The improved characteristics exhibited by the nanodot device may be attributed to Coulomb blockage at room temperature when nanodots smaller than about 10 nm in diameter are used for a floating gate, with the result that a threshold voltage shift may be quantized and multi-bit information may be stored. Accordingly, nanodot technology is considered promising for next-generation technology.

Conventional methods for forming nanodots typically utilize ion implantation to form nanodots on a sample, or rely on adjusting simple process conditions, e.g., deposition temperature, pressure, etc. Accordingly, using conventional methods, it may be difficult to form nanodots having a uniform size and distribution.

FIGS. 1A and 1B illustrate a conventional method of forming germanium (Ge) nanodots on silicon (Si) using a high nuclear generation density at a point where local stress is applied. Referring to FIG. 1A, first Ge nanodots 12a are formed on a silicon substrate 11a. The size and arrangement of the first Ge nanodots 12a tend to be nonuniform. In order to ameliorate the nonuniformity of size, referring to FIG. 1B, silicon 11b may be coated on the first Ge nanodots 12a. The surface of the deposited silicon 11b may be planar. However, the surface stress of the deposited silicon 11b is affected by the first Ge nanodots 12a formed below the deposited silicon 11b. After deposition of silicon 11b, second Ge nanodots 12b are formed on the silicon 11b. The location of the second Ge nanodots 12b may be affected by the location of the first Ge nanodots 12a. For example, the location of the second Ge nanodots 12b may correspond to the region where two Ge first nanodots 12a are adjacent to each other, which may be a result of formation of the first Ge nanodots 12a on a region where surface stress is at a minimum. Thus, the second Ge nanodots 12b may be formed between the two first Ge nanodots 12a. When depositions of silicon and Ge nanodots are repeated according to the above-described principle, Ge nanodots having a uniform size and distribution may be formed, as shown in FIG. 1B.

Another conventional method of forming nanodots (not illustrated) relies on the use of a dislocation network to form nanodots exhibiting uniform size and distribution. According to this method, a dislocation network, which has a regular distribution of dislocations, is initially formed on a substrate. A material is subsequently deposited on the substrate, upon which atoms of the material may move to a location related to the dislocation. These atoms may then crystallize, so that a nanodot array having a regular distribution is formed. In order to form the dislocation network using the above method, preprocessing should be performed so that a coherency strain is applied to the substrate before the nanodots are formed.

When an atomic layer composed of a metal, e.g., gallium (Ga), indium (In), titanium (Ti), aluminum (Al), etc., is formed on a silicon substrate using a method similar to the above-described dislocation network method, the deposition temperature of the atomic layer and thermal processing temperature must be properly adjusted in order to form metal nanodots having a regular arrangement. This allows atoms arranged according to a potential difference at a stacking fault on the surface of the silicon to move to an energetically stable location of the silicon, and subsequently crystallize to from metal nanodots having a regular arrangement.

In the above-described methods of forming nanodots having a regular arrangement, nanodots are formed on a substrate on which preprocessing has been performed to provide regularity. However, it is desirable to form a semiconductor device without such preprocessing. In particular, there is a need for a method of forming nanodots on a surface or layer having no regularity, e.g., a silicon oxide ($SiO_2$) layer.

Conventional methods do not allow for forming nanodots having uniform sizes equal to or smaller than 10 nanometers (nm) on a silicon oxide layer in a uniform array. That is, conventional methods of forming nanodots on a silicon oxide layer rely on adjusting the internal stress of the silicon oxide layer in order to drive an initial nuclear generation density, or rely on adjusting the density of a surface silanol group (Si—OH). Such methods may allow nanodots having a high density to be manufactured. However, since it may be difficult to adjust the size of the nanodots and/or to control the locations thereof, the methods may not be easily adapted to the practical manufacture semiconductor devices. Accordingly, there is a need for a method of manufacturing nanodots in which the size of nanodots is controlled and nanodots are regularly arranged.

SUMMARY OF THE INVENTION

The present invention is therefore directed to a nanodot material, and method of manufacturing the same, having nanodots formed on silicon oxide. The nanodots may have a uniform size and arrangement and may be used in, e.g., semiconductor devices, etc.

It is a feature of an embodiment of the present invention to provide a nanodot material having nanodots formed on silicon oxide.

It is another feature of an embodiment of the present invention to provide a method of manufacturing nanodots on silicon oxide.

At least one of the above and other features and advantages of the present invention may be realized by providing a nanodot material, including a silicon substrate, a silicon oxide layer on the silicon substrate, and a first plurality of nanodots on the silicon oxide layer.

The silicon oxide layer may be amorphous and the first plurality of nanodots may include silicon or a metallic material. The first plurality of nanodots may include crystalline nanodots and the metallic material may include Al, Ti, In, and/or Ga.

The nanodot material may also include a second plurality of nanodots between the silicon substrate and the silicon oxide layer and located in regions corresponding to the first plurality of nanodots. The nanodots of the first plurality of nanodots may be aligned with the nanodots of the second plurality of nanodots.

The first plurality of nanodots may include silicon and the second plurality of nanodots may include aluminum and the first plurality of nanodots may be formed directly on a second plurality of nanodots. The first plurality of nanodots may include silicon and the second plurality of nanodots may include aluminum.

Also disclosed is a semiconductor device, which may include a transistor having a floating gate, wherein the floating gate includes a nanodot material as set forth herein.

At least one of the above and other features and advantages of the present invention may be realized by providing a method of manufacturing nanodots on silicon oxide including forming a plurality of metal dots on a substrate, forming a silicon oxide layer, and forming nanodots on the silicon oxide layer, wherein the nanodots are formed in locations corresponding to the metal dots.

The locations corresponding to the metal dots may be locations proximate to the metal dots and may correspond to regions of the silicon oxide layer that have a surface stress that is higher than a surface stress for regions of the silicon oxide layer that are peripheral to the metal dots.

The plurality of metal dots may include Al, Ti, In, and/or Ga. The substrate may be crystalline silicon. The crystalline silicon substrate may have a direction (111) and forming the plurality of metal dots may include coating a metallic material to a thickness smaller than a monolayer on the silicon substrate.

Forming the silicon oxide layer may include depositing a silicon oxide layer on the silicon substrate and the metal dots. The substrate may be a silicon substrate and forming the silicon oxide layer may include oxidizing the silicon substrate. Forming the nanodots may include depositing silicon or a metallic material directly on the metal dots. If the nanodots include silicon, the method may include performing a hydrogen plasma process after forming the silicon oxide layer.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF THE INVENTION

Figure 1A:
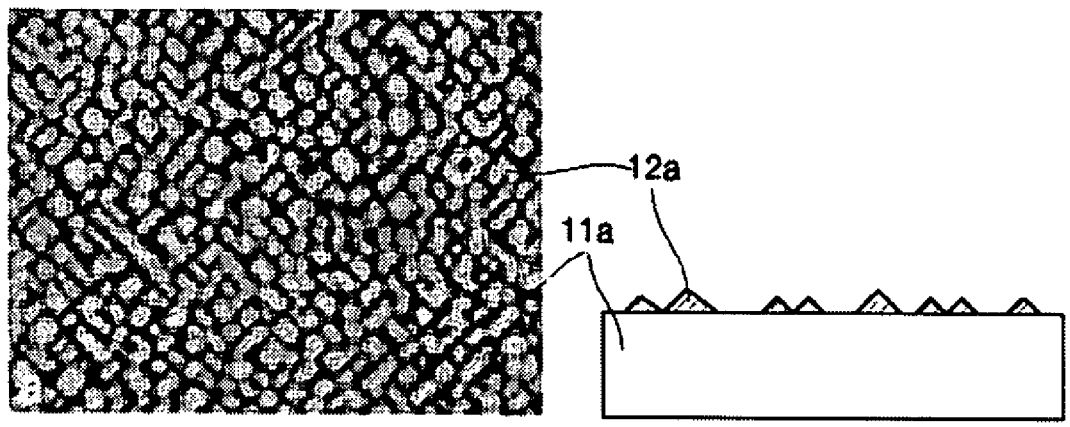
FIGS. 1A and 1B illustrate germanium nanodots on silicon formed by a conventional method.
Figure 1B:
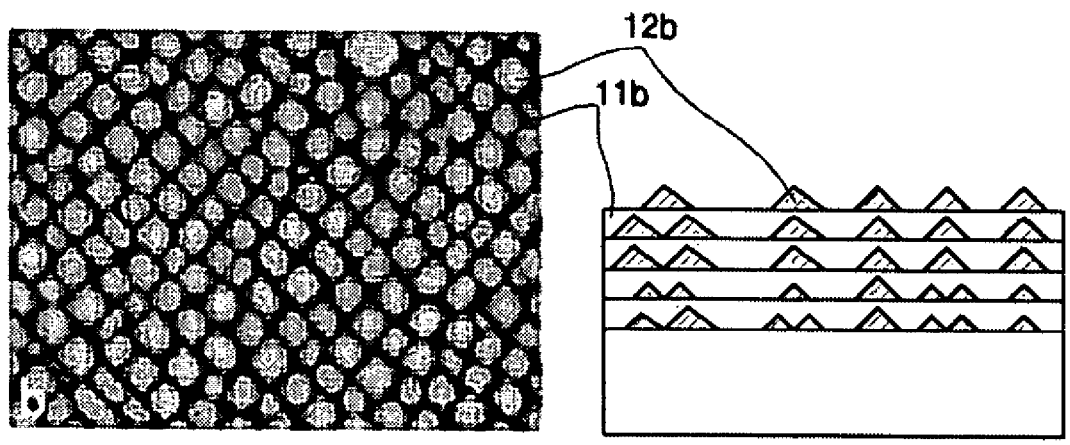

Korean Patent Application No. 10-2004-0055617, filed on Jul. 16, 2004, in the Korean Intellectual Property Office, and entitled: "NANODOTS FORMED ON SILICON OXIDE AND METHOD OF MANUFACTURING THE SAME," is incorporated by reference herein in its entirety.

The present invention will now be described more fully hereinafter with reference to the accompanying drawings, in which exemplary embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the figures, the dimensions of layers and regions are exaggerated for clarity of illustration. It will also be understood that when a layer is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Figure 2A:
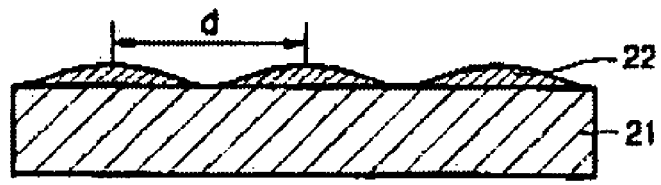
FIGS. 2A through 2D illustrate stages in a method of manufacturing nanodots on silicon oxide ($SiO_2$) according to an embodiment of the present invention.

FIGS. 2A through 2D illustrate stages in a method of manufacturing nanodots according to an embodiment of the present invention. Referring to FIG. 2A, a silicon substrate 21 having a crystalline direction (111) is provided. The silicon substrate 21 having uneven portions 22 may be prepared by typical methods of preparing a (111) oriented substrate. Uneven portions 22 formed on the silicon substrate 21 may exhibit a periodic pattern, e.g., a wave-shaped pattern, and a fine structure. That is, the periodic atomic relief d of the surface may be finely patterned. Note that the dimensions of the uneven portions 22 illustrated in FIG. 2A are exaggerated for clarity.

Figure 2B:
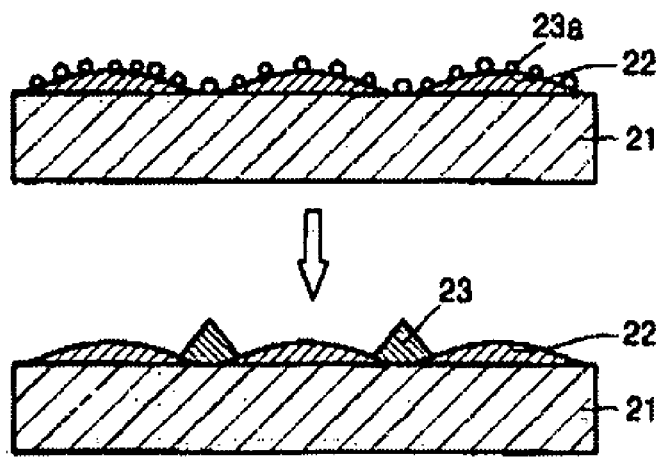

Referring to FIG. 2B, a metallic material, e.g., Al, Ti, In, Ga, etc., may be lightly deposited on the silicon substrate 21. The metallic material may be deposited on the surface by, e.g., a modifying an atomic layer deposition process to shorten a deposition time so as to reduce the amount of material deposited to a level below what is required to form a continuous atomic layer. Thus, individual metal atoms 23a may be discretely and irregularly located on the silicon substrate 21. The substrate 21 may be processed by, e.g., heating, so that metal atoms 23a are relocated on the surface of the substrate 21, e.g., to regions between uneven portions 22. The degree of deposition of the material may then vary due to the surface pattern of the silicon substrate 21. That is, the amount of the metallic material between the uneven portions 22 may be larger than the amount on the uneven portions 22. Thus, metal nanodots 23 may be formed between the uneven portions 22 of the silicon substrate 21. Note that the amount of deposited metal illustrated in FIG. 2B is exaggerated for clarity.

As described above, an embodiment of a method according to the present invention may provide a structure in which the metal nanodots 23 are regularly arranged on the silicon substrate 21. Thus, nanodots having a uniform size and alignment on a silicon oxide ($SiO_2$) layer may be obtained based on the structure in which the metal nanodots 23 are formed on the silicon substrate 21, as shown in FIG. 2B.

Figure 2C:
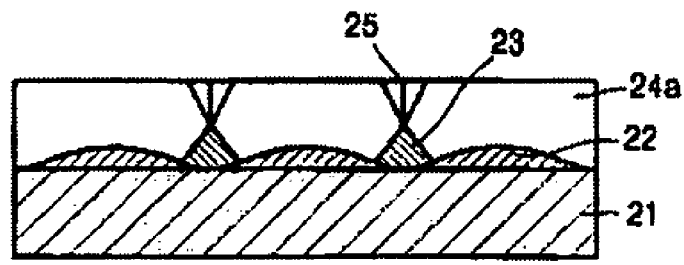

Referring to FIG. 2C, a layer 24a, e.g., a silicon oxide layer, may be formed on the silicon substrate 21 on which the metal nanodots 23 are formed using, e.g., chemical vapor deposition (CVD). The portion of the silicon oxide layer 24a formed above the metal nanodots 23 may be affected by the metal nanodots 23 such that a plurality of stress concentrating regions 25 exists. The stress concentrating regions 25 may have higher internal stresses than regions peripheral to the metal nanodots 23. Accordingly, stress may be concentrated in portions of the silicon oxide layer 24a formed above the metal nanodots 23.

Figure 2D:
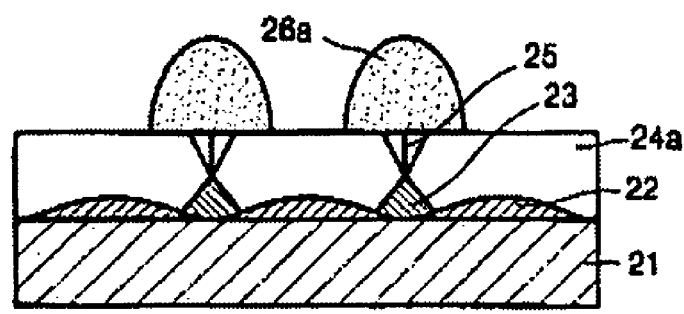

Formation of nanodots 26a, illustrated in FIG. 2D, will now be briefly described. A material, e.g., silicon, etc., may be deposited on the silicon oxide layer 24a using, e.g., CVD, to form nanodots 26a. The silicon oxide layer 24a formed on the metal nanodots 23 may have stress concentrating regions 25 having higher stress than peripheral regions. That is, the stress concentrating regions 25 may affect the surface of the silicon oxide layer 24a such that the distribution of stress on the surface of the silicon oxide layer 24a varies. The distribution of metal nanodots 23 disposed below the silicon oxide layer 24a may affect the distribution of stress on the surface of the silicon oxide layer 24a, and, thus, may affect crystalline growth of a material deposited on the silicon oxide layer 24a.

Thus, a material, e.g., silicon, etc., may be deposited on the silicon oxide layer 24a such that crystal growth occurs proximate to the stress concentrating regions 25 to form the nanodots 26a. The uniformity of size and distribution of the nanodots 26a may be improved by use of a uniform deposition speed during deposition of the silicon oxide layer 24a. The nanodots 26a formed on the silicon oxide layer 24a are not limited to silicon, and may be composed of other materials such as metals, e.g., Al, Ti, In and/or Ga, etc.

Figure 3A:
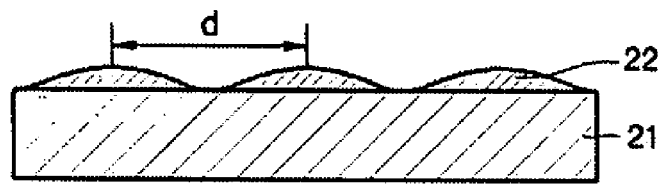
FIGS. 3A through 3D illustrate stages in a method of manufacturing nanodots on silicon oxide ($SiO_2$) according to another embodiment of the present invention.
Figure 3B:
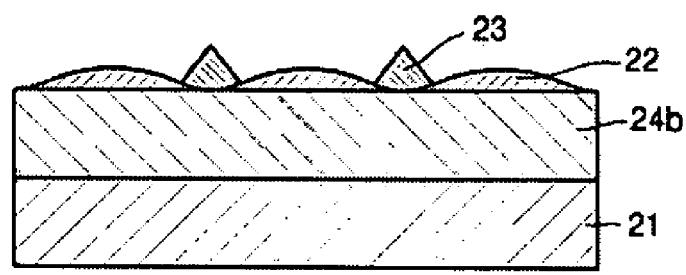

In another embodiment of the present invention, referring to FIGS. 3A-3B, an oxidation process, e.g., plasma oxidation, thermal oxidation, etc., may be performed on a silicon substrate 21 having nanodots, e.g., metal nanodots 23, formed thereon. A region of the silicon substrate 21, disposed below the metal nanodots 23, may be oxidized to form a silicon oxide layer 24b. Note that the surface of the metal nanodots 23 may be oxidized by the oxidation process, which may decrease the solubility of the resultant semiconductor device and undesirably lower a capability for storing electrons or a trapping capability, in which case a suitable process for coating the surface of the metal nanodots 23 may be employed.

Figure 3C:
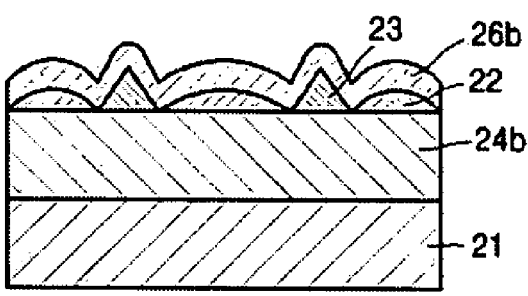

Referring to FIG. 3C, a material 26b, e.g., silicon, etc., may be deposited or coated on the substrate having the silicon oxide layer 24b and the metal nanodots 23 formed thereon. Portions of the silicon layer 26b deposited on the uneven portions 22 of the silicon oxide layer 24b and not formed on regions adjacent to the metal nanodots 23 are preferably removed. To this end, before depositing the silicon oxide layer 26b, hydrogen plasma processing may be performed on the silicon oxide layer 24b. If hydrogen plasma processing is performed, the silicon layer 26b may be deposited on the silicon oxide layer 24b and then heated to temperature of about 800° C. to promote selective decomposition of the silicon layer 26b through the chemical reaction represented by Equation 1:

$$SiO_2 + Si \rightarrow SiO + SiO \quad (1)$$

Figure 3D:
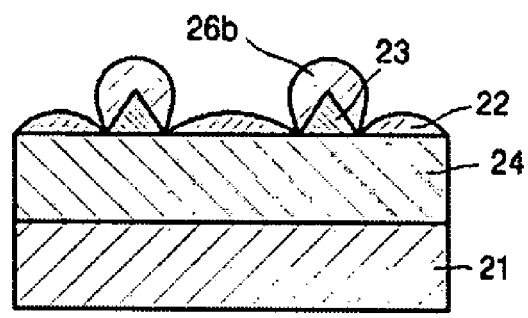

As described by Equation 1, portions of silicon oxide layer 24b on which hydrogen plasma processing has been performed may react with portions of the silicon layer 26b to form volatile SiO. This chemical reaction may occur mainly on the surface of the uneven portion 22 of the silicon oxide layer 24b. As a result, referring to FIG. 3D, silicon deposited on the surface of the uneven portions 22 may be removed. Thus, the metal nanodots 23 formed on the silicon oxide layer 24b and the silicon layer 26b formed on the metal nanodots 23 may remain, so that silicon nanodots 26b' formed from the silicon layer 26b and having a uniform size and arrangement on the silicon oxide layer 24b may be obtained.

EXPERIMENTAL EXAMPLE

A silicon (111) substrate was provided and an uneven surface with a periodicity of about 2.7 nm was formed on the surface. A 0.35 nm monolayer of Al was deposited on the silicon substrate at about 575° C. to form regularly arranged Al nanodots on the silicon substrate.

Next, a silicon oxide layer having a thickness of about 4 nm was deposited on the silicon substrate and the Al nanodots using inductively couple plasma CVD (ICP-CVD). The deposition temperature was about 400° C., silane ($SiH_4$) and nitrous oxide ($N_2O$) were used as material gasses and mixed with each other, and helium was used as a buffer gas.

Alternatively, to oxidize the surface of the silicon substrate and not separately deposit an oxide layer, oxygen plasma or a thermal oxidation processes may be employed. For the oxygen plasma process, electron cyclotron resonance (ECR) plasma may be used to generate high-density plasma, including a microwave output of 1000 W and plasma in which a $N_2O$ gas and helium are mixed at pressure of about 2 mTorr, and oxygen plasma processing may be performed with the plasma for about 5 minutes to form a silicon oxide layer having a thickness of about 5 nm. For the thermal oxidation process, the silicon substrate may be oxidized in a furnace heated to about 850° C. to form the silicon oxide layer on the surface of the silicon substrate. The silicon oxide layer may be formed above the silicon substrate and/or below the surface of the silicon substrate, depending on the nature of the oxidation process.

Silicon may then be deposited on the silicon oxide layer using, e.g., low pressure CVD (LP-CVD). For LP-CVD, the deposition process may include adjusting the pressure to about 30 to 100 mTorr and using $SiH_4$ as a material gas, decomposed at about 600° C. and deposited. As described above, an additional hydrogen plasma process may be employed before forming the silicon layer on the silicon oxide layer and the metal nanodots, e.g., according to the method illustrated in FIGS. 3A-3C. As a result, the silicon substrate, the silicon oxide layer and the silicon nanodots having a uniform size and arrangement may be formed.

According to the present invention, nanodots having a uniform size and arrangement on the silicon oxide layer may be formed. Nanodots manufactured according to the present invention may be used for semiconductor devices, optical devices, light emitting diodes, laser diodes, photodetectors, memory devices, etc., and device properties may be improved, e.g., a threshold current may be reduced and retention characteristics may be improved.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A nanodot material, comprising:
   a silicon substrate;
   a plurality of metal dots on the silicon substrate;
   a silicon oxide layer on the silicon substrate and having a plurality of stress concentrating regions in locations corresponding to the metal dots; and
   a plurality of silicon nanodots on the silicon oxide layer and in locations corresponding to the stress concentrating regions.

2. The nanodot material as claimed in claim 1, wherein the silicon oxide layer is amorphous.

3. The nanodot material as claimed in claim 1, wherein the plurality of silicon nanodots includes crystalline nanodots.

4. The nanodot material as claimed in claim 1, wherein the metal dots are between the substrate and the silicon oxide layer.

5. The nanodot material as claimed in claim 4, wherein the nanodots of the plurality of silicon nanodots on the silicon oxide layer are aligned with the metal dots under the silicon oxide layer.

6. The nanodot material as claimed in claim 4, wherein the metal dots include aluminum.

7. The nanodot material as claimed in claim 1, wherein the plurality of silicon nanodots is formed directly on the metal dots.

8. The nanodot material as claimed in claim 7, wherein the plurality of silicon nanodots includes silicon and the metal dots include aluminum.

9. A semiconductor device, comprising:
a charge trap layer having a floating gate, wherein the floating gate includes the nanodot material as claimed in claim 1.

10. A method of manufacturing nanodots on silicon oxide, comprising:
forming a plurality of metal dots on a silicon substrate;
forming a silicon oxide layer on the silicon substrate, the silicon oxide layer having a plurality of stress concentrating regions in locations corresponding to the metal dots; and
forming silicon nanodots on the silicon oxide layer, wherein the nanodots are formed in locations corresponding to the stress concentrating regions.

11. The method as claimed in claim 10, wherein the locations corresponding to the metal dots are locations proximate to the metal dots and corresponding to regions of the silicon oxide layer that have a surface stress that is higher than a surface stress for regions of the silicon oxide layer that are peripheral to the metal dots.

12. The method as claimed in claim 10, wherein the plurality of metal dots includes at least one metal selected from the group consisting of Al, Ti, In, and Ga.

13. The method as claimed in claim 10, wherein the silicon substrate is single-crystalline silicon and a surface pattern of the substrate corresponds to the crystal structure of the substrate.

14. The method as claimed in claim 13, wherein the silicon substrate is a (111) substrate and forming the plurality of metal dots comprises coating a metallic material to a thickness smaller than a monolayer on the silicon substrate.

15. The method as claimed in claim 10, wherein forming the silicon oxide layer comprises depositing a silicon oxide layer on the silicon substrate and the metal dots.

16. The method as claimed in claim 10, wherein the substrate is a silicon substrate and forming the silicon oxide layer comprises oxidizing the silicon substrate to form the silicon oxide layer under the metal dots.

17. The method as claimed in claim 16, wherein forming the nanodots comprises depositing silicon directly on the metal dots.

18. The method as claimed in claim 17, wherein the nanodots include silicon, the method further comprising performing a hydrogen plasma process after forming the silicon oxide layer.

19. The nanodot material as claimed in claim 1, wherein the substrate is single-crystalline and a surface pattern of the substrate corresponds to the crystal structure of the substrate.

20. The nanodot material as claimed in claim 19, wherein the silicon substrate is a (111) substrate.

21. The nanodot material as claimed in claim 1, wherein the silicon oxide layer includes dislocations that are directly above the metal dots, and nanodots of the plurality of silicon nanodots are directly above the dislocations.

22. The nanodot material as claimed in claim 1, wherein metal dots include at least one metal selected from the group consisting of Al, Ti, In, and Ga.

23. A nanodot material, comprising:
a silicon substrate;
a silicon oxide layer on the silicon substrate and having a plurality of stress concentrating regions in locations corresponding to
a plurality of metal dots, the metal dots being disposed on the silicon oxide layer; and
a plurality of silicon nanodots in locations corresponding to the stress concentrating regions.

24. The nanodot material as claimed in claim 23, the plurality of silicon nanodots is formed directly on the metal dots.

25. The nanodot material as claimed in claim 1, wherein the locations corresponding to the metal dots are locations proximate to the metal dots and corresponding to regions of the silicon oxide layer that have a surface stress that is higher than a surface stress for regions of the silicon oxide layer that are peripheral to the metal dots.

* * * * *